United States Patent
Pedersen et al.

(10) Patent No.: US 12,168,601 B2
(45) Date of Patent: Dec. 17, 2024

(54) INTERCONNECTION SCHEME FOR DIELECTRIC ELEMENT SENSOR

(71) Applicant: Knowles Electronics, LLC, Itasca, IL (US)

(72) Inventors: Michael Pedersen, Long Grove, IL (US); Peter V. Loeppert, Durand, IL (US)

(73) Assignee: Knowles Electronics, LLC, Itasca, IL (US)

( * ) Notice: Subject to any disclaimer, the term of this patent is extended or adjusted under 35 U.S.C. 154(b) by 443 days.

(21) Appl. No.: 17/715,184

(22) Filed: Apr. 7, 2022

(65) Prior Publication Data

US 2023/0322547 A1    Oct. 12, 2023

(51) Int. Cl.
*B81B 7/02*       (2006.01)

(52) U.S. Cl.
CPC ........ *B81B 7/02* (2013.01); *B81B 2203/0127* (2013.01); *B81B 2203/04* (2013.01); *B81B 2207/07* (2013.01)

(58) Field of Classification Search
CPC .............. B81B 7/02; B81B 2203/0127; B81B 2203/04; B81B 2207/07; B81B 2201/0257; B81B 3/0086; H04R 19/04; H04R 19/005
See application file for complete search history.

(56) References Cited

U.S. PATENT DOCUMENTS

| | | | |
|---|---|---|---|
| 2013/0161702 A1* | 6/2013 | Chen | B81C 1/00246 |
| | | | 257/E27.006 |
| 2015/0001647 A1* | 1/2015 | Dehe | H04R 31/00 |
| | | | 257/416 |
| 2018/0146296 A1* | 5/2018 | Meisel | H04R 19/005 |

* cited by examiner

*Primary Examiner* — Mohammed R Alam

(74) *Attorney, Agent, or Firm* — FLENER IP & Business Law; Zareefa B. Flener

(57) ABSTRACT

A microelectromechanical systems (MEMS) die comprises a first diaphragm having a first side and a second side, and a second diaphragm having a first side facing the first side of the first diaphragm. A first plurality of interconnect strips is disposed along at least the first side of the first diaphragm, a second plurality of interconnect strips is disposed along the first side of the first diaphragm, and a third plurality of interconnect strips is disposed along the first side of the second diaphragm. First, second, and third runner strips are disposed along the second side of the first diaphragm transverse to the first, second, and third plurality of interconnect strips, respectively. Each of the first, second, and third runner strips is electrically connected to at least a subset of the first, second, and third plurality of interconnect strips, respectively, via electrical connections disposed through the first diaphragm.

23 Claims, 7 Drawing Sheets

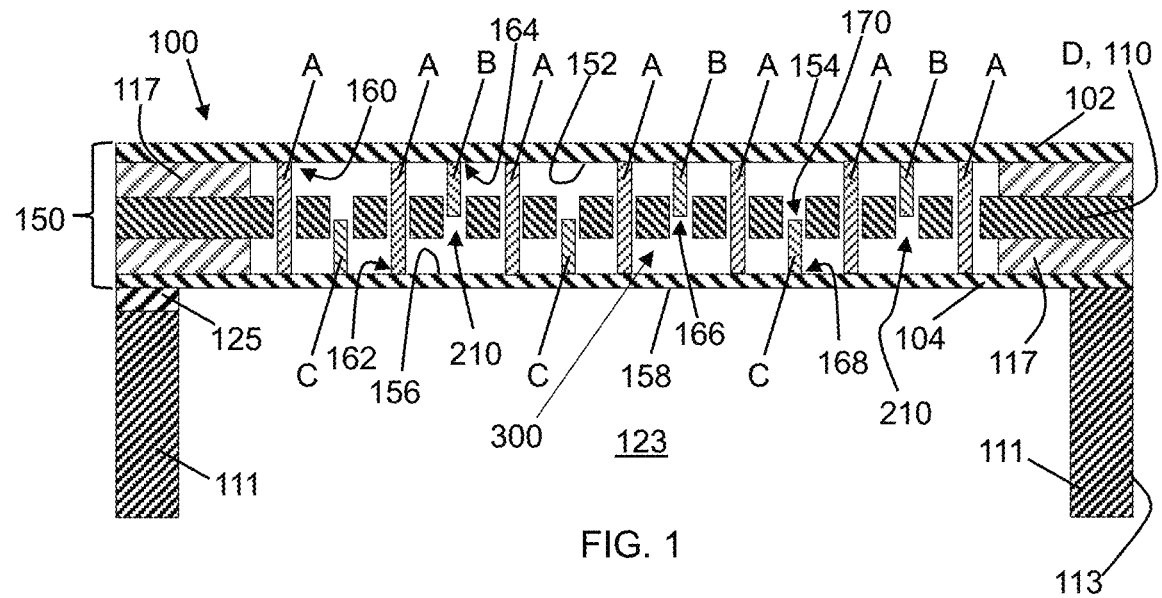
FIG. 1
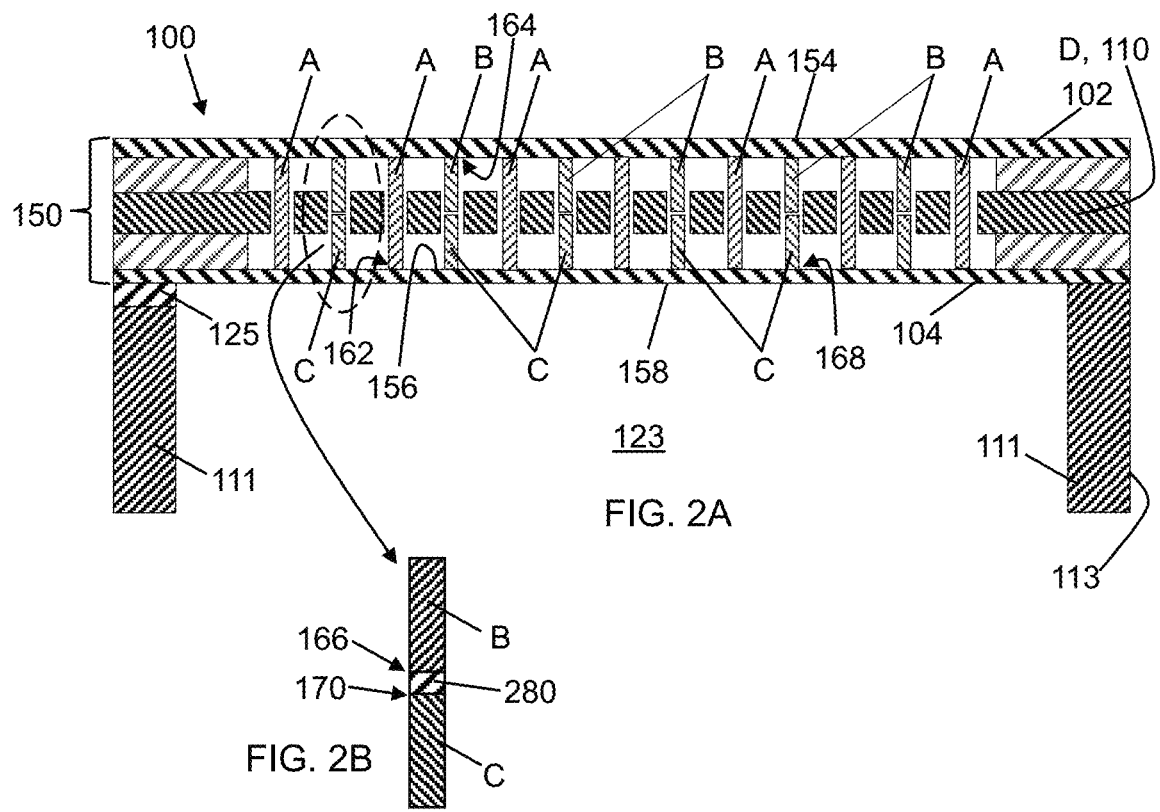
FIG. 2A
FIG. 2B

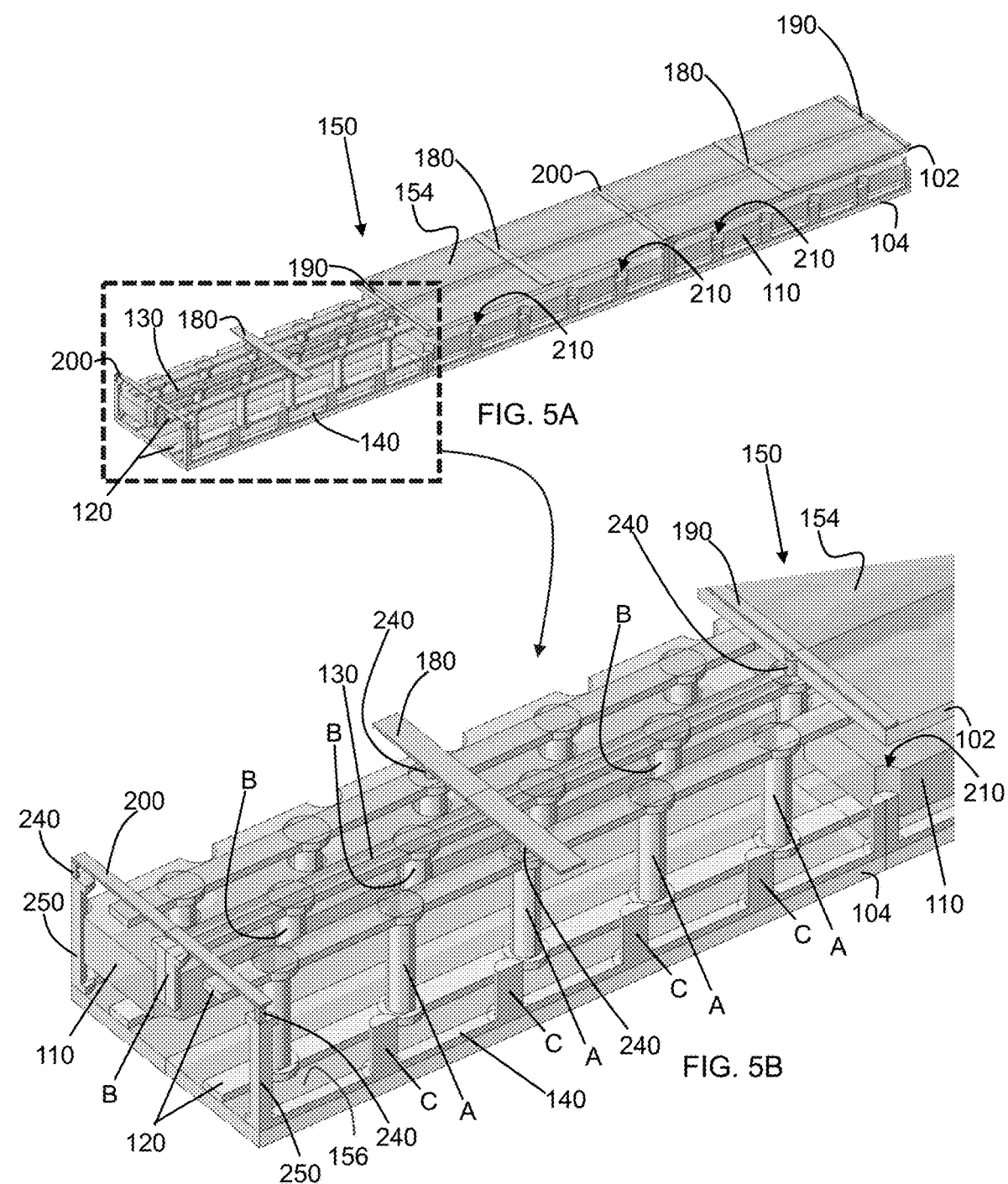

INTERCONNECTION SCHEME FOR DIELECTRIC ELEMENT SENSOR

FIELD OF THE DISCLOSURE

The present disclosure relates generally to an interconnection scheme for a microelectromechanical systems (MEMS) die, and more particularly to an interconnection scheme having metal runners applied to an outside surface of the MEMS die.

BACKGROUND

It is known that in the fabrication of MEMS devices often a plurality of devices are manufactured in a single batch process in the form of a wafer(s). Individual portions of the batch processed wafer(s) representative of individual MEMS devices are known as dies. Accordingly, a number of MEMS dies can be manufactured in a single batch processed wafer and then cut apart or otherwise separated for further fabrication steps or for their ultimate use, which for example without limitation includes use as an acoustic transducer or other portion of a microphone.

Polysilicon has properties making it a convenient material for use in the fabrication of layered MEMS dies, for example, for use as conductive elements inside the MEMS dies. However, the resistivity of polysilicon limits the geometries in which it can be effectively used.

DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope.

FIG. 1 is a cross-sectional schematic view of a MEMS die according to an embodiment FIG. 2A is a cross-sectional schematic view of a MEMS die according to another embodiment.

FIG. 2B is an expanded view of the portion of FIG. 2A within the dashed ellipse, showing an aspect of a further embodiment.

FIG. 5A is a three-dimensional view of a portion of an exemplary embodiment of a diaphragm assembly, wherein portions of the first diaphragm and of the fixed dielectric element are cut away.

FIG. 5B is an enlarged view of the portion of FIG. 5A within the dashed rectangle.

Figure 3:
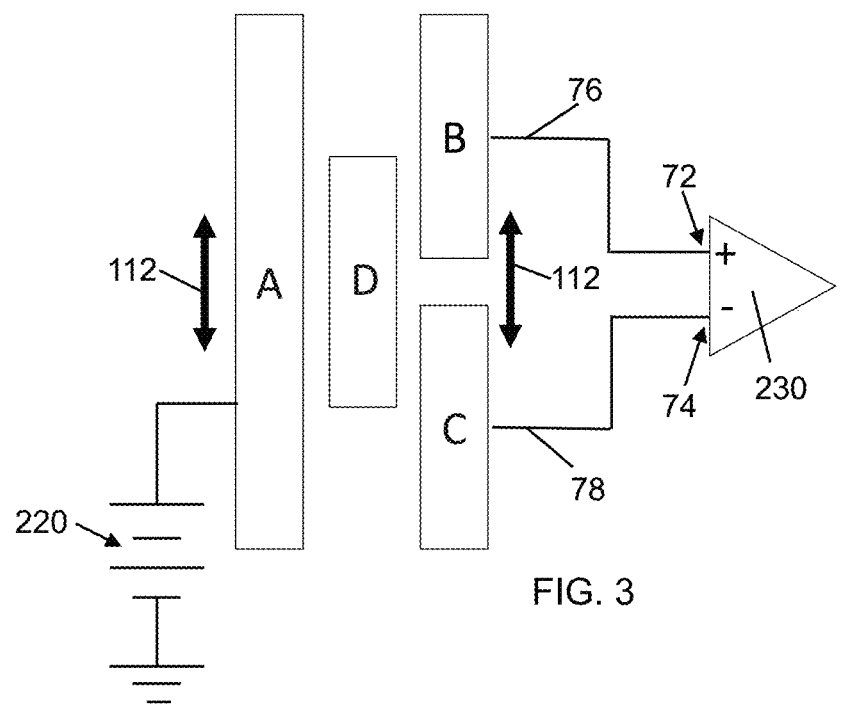
FIG. 3 is a hybrid diagram illustrating a possible geometric relation of individual pillar electrodes A, B, and C relative to a fixed dielectric element D in combination with an electrical schematic illustrating exemplary electrical connections with additional components.

In the following detailed description, various embodiments are described with reference to the appended drawings. The skilled person will understand that the accompanying drawings are schematic and simplified for clarity. Like reference numerals refer to like elements or components throughout. Like elements or components will therefore not necessarily be described in detail with respect to each figure.

DETAILED DESCRIPTION

According to various embodiments described herein, a MEMS die comprises a diaphragm assembly comprising a first diaphragm having a first side and a second side and a second diaphragm having a first side facing the first side of the first diaphragm and a second side facing away from the first diaphragm. In an embodiment a first plurality of interconnect strips is disposed along at least one of the first side of the first diaphragm and the first side of the second diaphragm, a second plurality of interconnect strips is disposed along the first side of the first diaphragm, and a third plurality of interconnect strips is disposed along the first side of the second diaphragm. In an embodiment a first runner strip is disposed along the second surface of the first diaphragm transverse to the first plurality of interconnect strips and electrically connected to at least a subset of the first plurality of interconnect strips via electrical connections disposed through the first diaphragm, a second runner strip is disposed along the second surface of the first diaphragm transverse to the second plurality of interconnect strips and electrically connected to at least a subset of the second plurality of interconnect strips via electrical connections disposed through the first diaphragm, and a third runner strip is disposed along the second surface of the first diaphragm transverse to the third plurality of interconnect strips and electrically connected to at least a subset of the third plurality of interconnect strips via electrical connections disposed through the first diaphragm.

In an embodiment, the MEMS die comprises a first plurality of electrodes, a second plurality of electrodes, a third plurality of electrodes. In an embodiment each of the first plurality of electrodes has a first end connected to the first side of the first diaphragm and a second end connected to the first side of the second diaphragm, and each of the first plurality of electrodes is in electrical communication with one of the first plurality of interconnect strips. Each of the second plurality of electrodes has a first end connected to the first side of the first diaphragm in electrical communication with one of the second plurality of interconnect strips, and a free second end. Each of the third plurality of electrodes has a first end connected to the first side of the second diaphragm in electrical communication with one of the third plurality of interconnect strips, and a second free end. In an embodiment, the MEMS die further comprises a fixed dielectric element spaced between the first and second diaphragms and including a plurality of apertures. In an embodiment each electrode of the first, second, and third pluralities of electrodes is disposed at least partially within an aperture of the plurality of apertures, and the fixed dielectric element surrounds the second ends of each of the second plurality of electrodes and the second ends of each of the third plurality of electrodes. In an embodiment, the third runner strip is electrically connected to at least the subset of the third plurality of interconnect strips via electrical connections each comprising a first pin disposed through the first diaphragm connecting the third runner strip to a second pin disposed between the first and second diaphragms and electrically connected to one of the third plurality of interconnect strips.

In an embodiment, a MEMS device comprises a MEMS die as described above, and further comprises a voltage source electrically connected to the first runner strip to provide a voltage bias to at least the first subset of interconnect strips relative to ground, and a differential amplifier. In an embodiment, a first electrical connection is disposed between the second runner strip and a first input to the differential amplifier, and a second electrical connection is disposed between the third runner strip and a second input to the differential amplifier. In an embodiment the MEMS device further comprises an integrated circuit (IC), wherein the IC comprises the voltage source and the differential amplifier, and a housing. In an embodiment the housing comprises a base having a first surface, an opposing second surface, a port, and a cover attached to the first surface of the base, wherein the cover and the base define an interior of the housing. In an embodiment the port extends between the first surface and the second surface, and the diaphragm assembly is disposed within the interior of the housing such that the second diaphragm is over the port, and the integrated circuit (IC) is disposed within the interior of the housing and electrically connected to the diaphragm assembly.

According to an embodiment, the first, second, and third pluralities of electrodes are movable relative to the solid dielectric. In an embodiment, one or more of the second plurality of electrodes is coaxially disposed with one or more of the third plurality of electrodes. In an embodiment, the second end of the one or more of the second plurality of electrodes is connected by a dielectric support layer to the second end of the one or more of the third plurality of electrodes. In an embodiment, the first, second, and third pluralities of interconnect strips and the first, second, and third pluralities of electrodes are made from polysilicon and the first, second, and third runners are made from metal. In an embodiment a low pressure region is defined between the first side of the first diaphragm and the first side of the second diaphragm. In an embodiment the MEMS die further comprises a tunnel structure disposed through the first and second diaphragms, wherein the tunnel structure provides fluid communication between the second sides of the first and second diaphragms, and wherein the tunnel structure is configured to maintain the low pressure region disposed between the first sides of the first and second diaphragms outside of the tunnel structure.

FIG. 1 illustrates a schematic representation of a cross section of an exemplary MEMS die 100 comprising first and second diaphragms 102, 104 that are movable relative to a fixed dielectric element 110, also labeled as D. The fixed dielectric element D, 110 is relatively thick and/or stiff compared to the first and second diaphragms 102 and 104, for example by being fabricated using thicker materials or using thin very high tensile stress films to maintain sufficient rigidity. The fixed dielectric element 110 remains relatively motionless when the first and second diaphragms 102 and 104 are deflected.

In an embodiment the MEMS die 100 includes a substrate 111 having an outer boundary 113 as indicated in FIG. 1. In an embodiment the substrate 111 has a generally rectangular perimeter, but in other embodiments it can be any shape. The substrate 111 in an embodiment includes an opening 123 formed therethrough. In an embodiment the substrate 111 is made of silicon.

In an embodiment the second diaphragm 104 is attached to the substrate 111 over an opening 123 via a spacer layer 125, as shown on the left side of FIG. 1. However, in an embodiment of the MEMS die 100, at least a portion of the second diaphragm 104 is attached directly to the substrate 111, as shown on the right side of FIG. 1. In some embodiments the spacer layer 125 can be an integral part of the substrate 111 or added onto the substrate 111 as an additional sacrificial layer 125. The spacer layer 125 can, for example, be made of any insulative material as described hereinbelow. A radially outer portion of each of the first and second diaphragms 102, 104 is rigidly attached to a radially outer portion of the fixed dielectric element D, 110. In an embodiment, a material 117 (see FIGS. 1 and 6) is disposed between the fixed dielectric element 110 and each of the first and second diaphragms 102 and 104. The material 117 can be a sacrificial material that can, for example, be made of any insulative material as described hereinbelow.

In an embodiment the MEMS die 100 further comprises first, second, and third pluralities of pillar electrodes, for example, grouped into three groups respectively labeled as A, B, and C, and further arranged on the first and second diaphragms 102, 104 relative to the fixed dielectric element D, 110 as shown in FIG. 1. It should be noted that although the three pluralities of pillar electrodes labeled A, B, and C in FIG. 1 are shown in the same cross-sectional plane, each plurality can be arranged within its own plane that can be parallel to or diagonal to the page in FIG. 1.

Referring to FIGS. 1, 5A and 5B, the fixed dielectric element D, 110 is spaced between the first and second diaphragms 102, 104 and includes a plurality of apertures 210 disposed therethrough. Each electrode of the first, second, and third pluralities of electrodes A, B, C is disposed at least partially within an aperture of the plurality of apertures 210. The fixed dielectric element D, 110 surrounds the second ends 166 of each of the second plurality of electrodes, B, and the second ends 170 of each of the third plurality of electrodes, C.

Figure 6A:
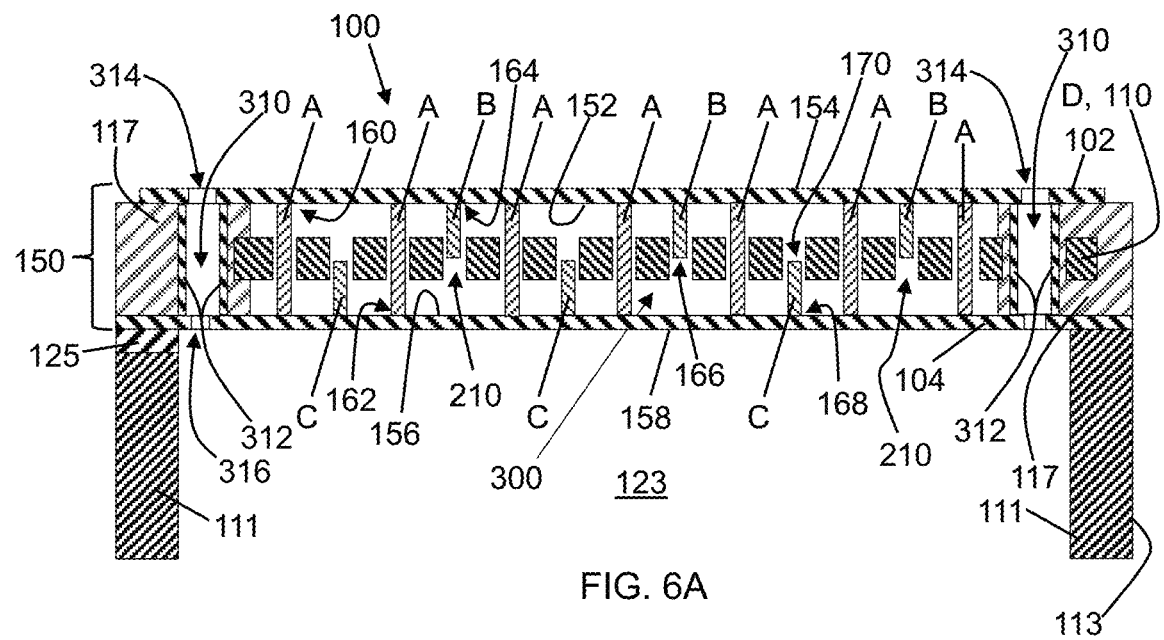
FIG. 6A is a cross-sectional schematic view of a MEMS die according to a further embodiment.
Figure 6B:
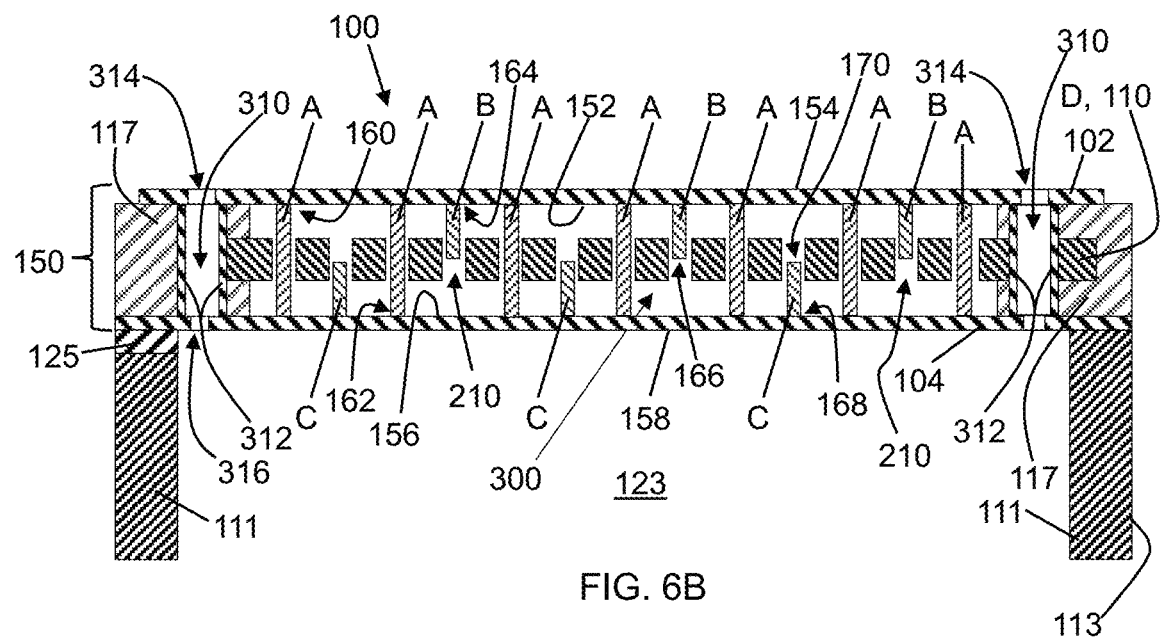
FIG. 6B is a cross-sectional schematic view of a MEMS die according to yet another embodiment.
Figure 6C:
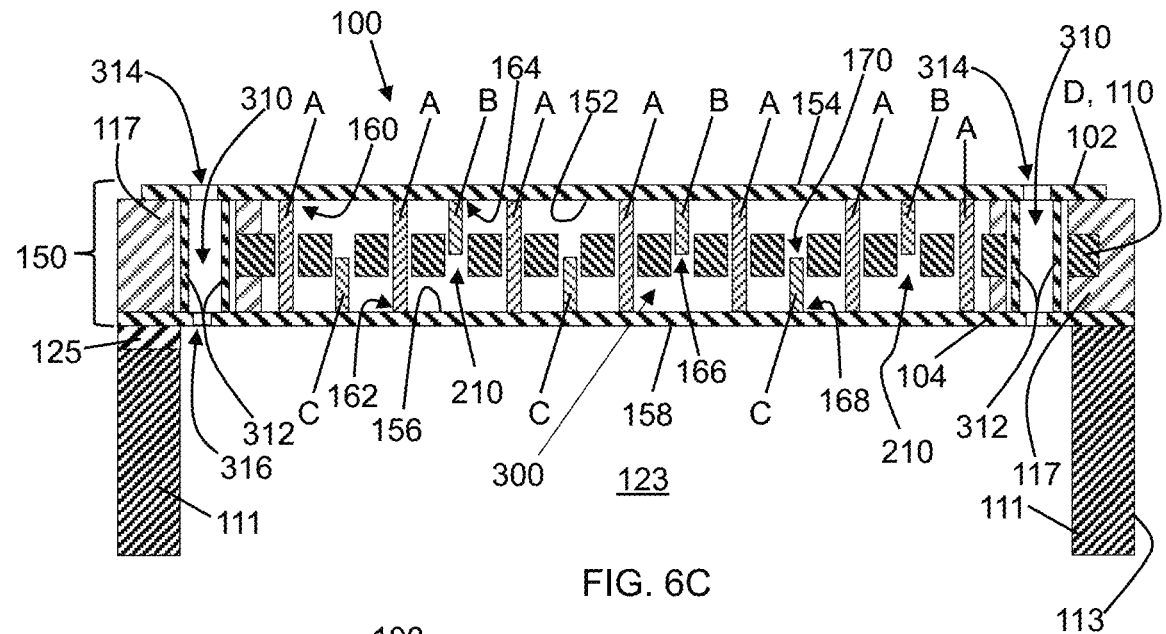
FIG. 6C is a cross-sectional schematic view of a MEMS die according to yet a further embodiment.

In an embodiment each of the first and second diaphragms 102, 104 extends radially to the outer boundary 113 of the substrate 111, as illustrated in FIG. 1. In other embodiments the first and second diaphragms 102, 104 extend over the opening 123 but one or both of the first and second diaphragms 102, 104 does not extend radially to the outer boundary 113, as illustrated in FIGS. 6A-6C. A mechanically active area for each of the first and second diaphragms 102, 104 is defined by the innermost radial boundary (the release front) of the material 117 disposed between the fixed dielectric element 110 and each of the first and second diaphragms 102, 104. As shown in FIGS. 1, 2A, and 6A-6C, in an embodiment portions of the first and second diaphragms 102, 104 extend radially beyond the release fronts. In an embodiment the fixed dielectric element 110 extends radially to the outer boundary 113 of the substrate 111, as illustrated in FIG. 1. In other embodiments the fixed dielectric element 110 extends over the opening 123 but does not extend radially to the outer boundary 113, as illustrated in FIGS. 6A-6C.

FIG. 3 illustrates a schematic electrical diagram and a possible geometric relation of individual pillar electrodes A, B, and C relative to the fixed dielectric element D, including exemplary electrical connections including additional components as will be further described hereinbelow. It has been found that such an arrangement of electrodes, wherein the pillar electrodes A, B, and C are movable relative to the fixed dielectric element D, 110 as indicated by the arrows 112 can be used as a sensor, for example without limitation, as an acoustic actuator or microphone.

In an embodiment, as illustrated in FIG. 3, at least a subset of the first plurality of electrodes, A, is electrically biased by a DC voltage source 220 relative to ground. Motion of the first and second diaphragms 102, 104 relative to the fixed dielectric element 110 caused by input including, for example without limitation, sound pressure, vibration, or acceleration, causes a corresponding motion of the pillar electrodes A, B, and C relative to the fixed dielectric element D, 110. Such motion can be detected as changes in output voltage levels that can be amplified, for example, using a differential amplifier 230 as illustrated in FIG. 3.

In the electrical schematic of FIG. 3, the differential amplifier 230 includes first and second inputs 72, 74. A first electrical connection 76 connects at least a subset of the second plurality of electrodes, B, to the first input 72 to the differential amplifier 220. A second electrical connection 78 connects at least a subset of the second plurality of electrodes, C, to the second input 74 to the differential amplifier 230. A sensor device utilizing the MEMS die 100 generates one or more voltage signals resulting from movement of the first and second diaphragms 102, 104 relative to the fixed dielectric element 110, and the one or more signals are electrically connected to first and second inputs 72, 74 of the differential amplifier 230. Physical connections that effectuate these electrical connections shown in FIG. 3 are more fully described hereinbelow.

In an embodiment, each of the first and second inputs 72, 74 of the differential amplifier 230 has an input impedance greater than about 1 giga-ohm. The input impedances of the first and second inputs 72, 74 establishes a DC bias level at each input of less than the power supply DC bias level relative to ground potential and preferably less than half of the power supply DC bias level relative to ground potential.

Figure 4:
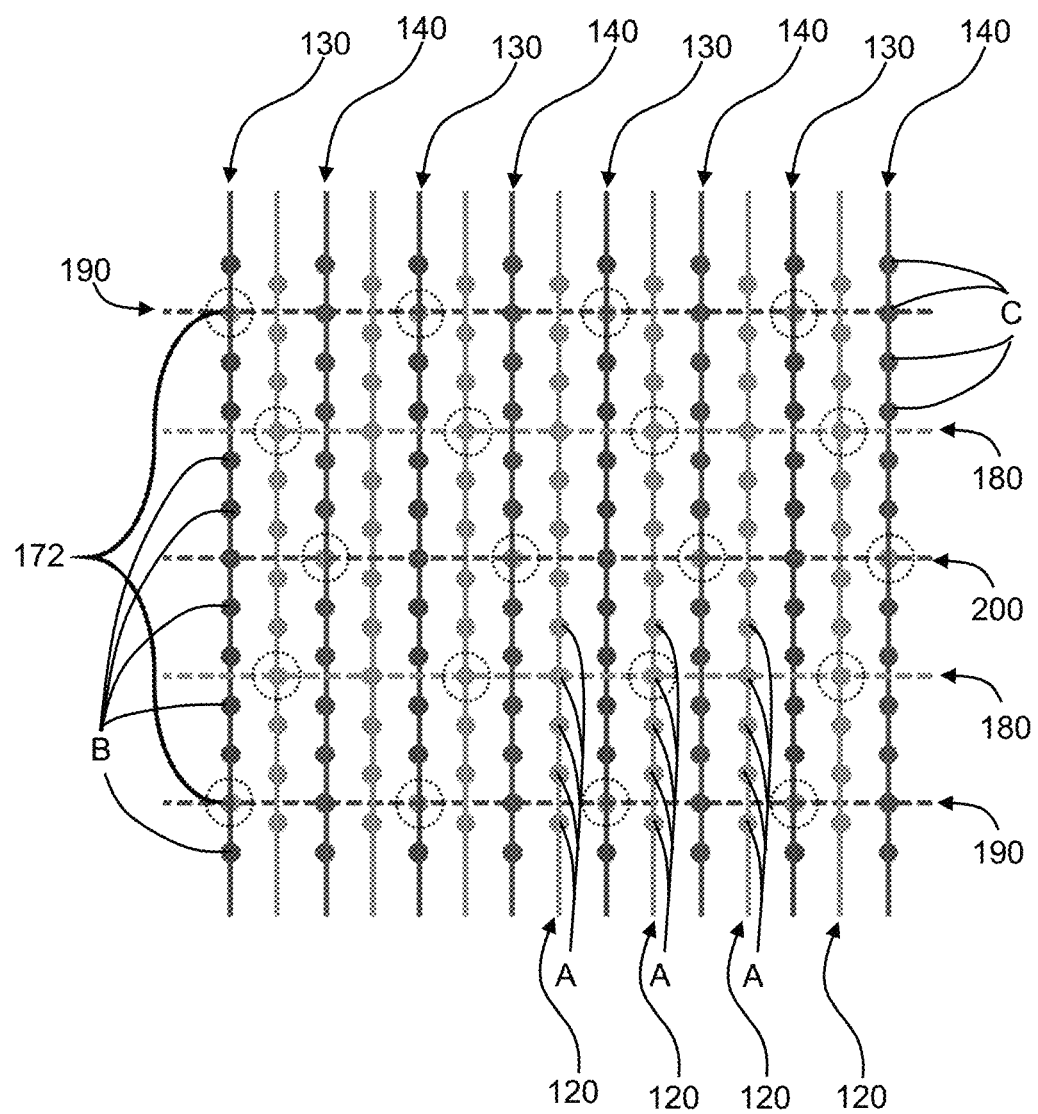
FIG. 4 is a schematic top view illustrating exemplary interconnect strips and runner strips of an exemplary MEMS die according to an embodiment.

FIG. 4 is a schematic top view of the exemplary MEMS die 100 shown in FIG. 1, illustrating exemplary electrical connections between the pillar electrodes of the three pluralities of pillar electrodes A, B, C. Referring to FIG. 4, in an embodiment, subsets of the first plurality of pillar electrodes A, attached to the first and second diaphragms 102, 104 in FIG. 1, are shown arranged vertically and electrically connected by a first plurality of interconnect strips 120. For clarity of illustration only some of the first plurality of pillar electrodes A are labeled.

Still referring to FIG. 4, subsets of the second plurality of pillar electrodes B, attached to the first diaphragm 102 in FIG. 1, are shown arranged vertically and electrically connected by a second plurality of interconnect strips 130. For clarity of illustration only the leftmost line of the second plurality of pillar electrodes B is labeled. Similarly, subsets of the third plurality of pillar electrodes C, attached to the second diaphragm 104 in FIG. 1, are shown arranged vertically and electrically connected by a third plurality of interconnect strips 140. For clarity of illustration only the rightmost line of the third plurality of pillar electrodes C is labeled.

FIG. 5A shows a three-dimensional view of a portion of an exemplary embodiment of a diaphragm assembly 150, wherein portions of the first diaphragm 102 and of the fixed dielectric element D, 110 are cut away providing visual access to an interior of the diaphragm assembly 150. FIG. 5B is an enlarged view of the portion of FIG. 5A within the dashed rectangle.

Referring now to FIGS. 1 and 4-5B, an exemplary structural arrangement of the components of the MEMS die 100 includes a diaphragm assembly 150, that in turn comprises the first diaphragm 102 having a first side 152 and a second side 154. The second diaphragm 104 has a first side 156 facing the first side 152 of the first diaphragm 102 and a second side 158 facing away from the first diaphragm 102. The first plurality of electrodes, labeled as A, each has a first end 160 connected to the first side 152 of the first diaphragm 102 and a second end 162 connected to the first side 156 of the second diaphragm 104. A first plurality of interconnect strips 120 is disposed at least along the first side 152 of the first diaphragm 102 and optionally along the first side 156 of the second diaphragm 104. The first plurality of interconnect strips 120 is omitted from FIG. 1 for clarity but is well illustrated in FIGS. 5A and 5B. Each of the first plurality of electrodes, A, is in electrical communication with one of the first plurality of interconnect strips 120.

The second plurality of electrodes, labeled as B, each has a first end 164 connected to the first side 152 of the first diaphragm 102 and a free second end 166. A second plurality of interconnect strips 130 is disposed along the first side 152 of the first diaphragm 102. The second plurality of interconnect strips 130 is omitted from FIG. 1 for clarity but is well illustrated in FIGS. 5A and 5B. Each of the second plurality of electrodes, B, is in electrical communication with one of the second plurality of interconnect strips 130. Similarly, the third plurality of electrodes, labeled as C, each has a first end 168 connected to the first side 156 of the second diaphragm 104 and a free second end 170. A third plurality of interconnect strips 140 is disposed along the first side 156 of the second diaphragm 104. The third plurality of interconnect strips 140 is omitted from FIG. 1 for clarity but is well illustrated in FIGS. 5A and 5B. Each of the third plurality of electrodes, C, is in electrical communication with one of the third plurality of interconnect strips 140.

The above described structure requires the proper interconnection of the three groups of pillar electrodes A, B, C across each of the first and second diaphragms 102, 104 in two dimensions and as symmetrically as possible to achieve a desired performance. In reality, given the number and size of the components, and the actual arrangement of each plurality of pillar electrodes, A, B, C relative to the other, such proper interconnection can be difficult. For a MEMS layer stack that is built from bottom to top as visible in FIGS. 5A and 5B, this difficulty is caused at least in part because the third plurality of interconnect strips 140 that connects the third plurality of electrodes, C, will be buried deep within the MEMS layer stack. Conventional conductive materials used in this sort of buried interconnection include polysilicon. However, because of the relative length and width of the interconnections involved, the interconnection material requires a resistivity that is an order of magnitude less than can be realized with polysilicon. Therefore, other materials such as metals must be considered, which leads to concerns about thermal budgets and material integration in the MEMS process sequence.

In an embodiment, additional metal interconnection layers, or runner strips, are added to the top of the MEMS layer stack after all high temperature processing is done. The runner strips are used to connect to the buried interconnection structures in banks, which therefore allows for the continued use of polysilicon as buried interconnect material. Adoption of this approach allows for conventional processing, while maintaining acceptable symmetry and performance.

For example, referring again to FIG. 4, the bracket 172 represents the maximum span for the first, second, and third pluralities of interconnect strips 120, 130, 140 if they were made from polysilicon. At least one runner strip would therefore be needed to connect to each plurality of interconnect strips 120, 130, 140 within the span 172.

As can be seen in FIGS. 4-5B, at least one first runner strip 180 is disposed along the second surface 154 of the first diaphragm 102 transverse to the first plurality of interconnect strips 120. As schematically indicated by the dashed circles in FIG. 4 encircling some of the intersection points between the at least one first runner strip 180 and the first plurality of interconnect strips 120, the at least one first runner strip 180 is electrically connected to at least a subset of the first plurality of interconnect strips 120 via electrical connections that are disposed through the first diaphragm 102 as will be further explained hereinbelow in regard to FIGS. 5A and 5B.

At least one second runner strip 190 is disposed along the second surface 154 of the first diaphragm 102 transverse to the second plurality of interconnect strips 130. As schematically indicated by the dashed circles in FIG. 4 encircling some of the intersection points between the at least one second runner strip 190 and the second plurality of interconnect strips 130, the at least one second runner strip 190 is electrically connected to at least a subset of the second plurality of interconnect strips 130 via electrical connections that are disposed through the first diaphragm 102 and as will be further explained hereinbelow in regard to FIGS. 5A and 5B.

At least one third runner strip 200 is disposed along the second surface 154 of the first diaphragm 102 transverse to the third plurality of interconnect strips 140. As schematically indicated by the dashed circles in FIG. 4 encircling some of the intersection points between the at least one third runner strip 200 and the third plurality of interconnect strips 140, the at least one third runner strip 200 is electrically connected to at least a subset of the third plurality of interconnect strips 140 via electrical connections that are disposed through the first diaphragm 102 and as will be further explained hereinbelow in regard to FIGS. 5A and 5B.

FIGS. 5A and 5B are illustrative of the physical connections effectuating the electrical connections described hereinabove. For example, as noted above, each of the first plurality of electrodes, A, is in electrical communication with one of the first plurality of interconnect strips 120. The electrical connection is provided in an embodiment by one or more first pins 240 that each extends from a bottom surface of each of the first, second, and third runner strips 180, 190, 200. The one or more first pins 240 are disposed through the first diaphragm 102. Therefore, the at least one first runner strip 180 is electrically connected to at least a subset of the first plurality of interconnect strips 120 via one or more first pins 240 that are disposed through the first diaphragm 102. Similarly, the at least one second runner strip 190 is electrically connected to at least a subset of the second plurality of interconnect strips 130 via one or more first pins 240 that are disposed through the first diaphragm 102.

The third plurality of interconnect strips 140 is only disposed on the first surface 156 of the second diaphragm 104. To make a physical and electrical connection between the third plurality of interconnect strips 140 and the third plurality of runner strips 200, one or more second pins 250 are disposed between the first and second diaphragms 102, 104 and in electrical communication with the third plurality of interconnect strips 140. As can be seen in FIG. 5B, the one or more first pins 240 are disposed through the first diaphragm 102 connecting the third plurality of runner strips 200 to the second pins 250.

In an embodiment, electrical connections between the first, second, and third pluralities of runner strips 180, 190, 200 and components outside of the MEMS die 100 are made via wires or traces 260, 262, 264, respectively, disposed on the second surface 154 of the first diaphragm 102. For example, referring to FIG. 7 in an embodiment, the first plurality of runner strips 180 is electrically connected together via traces 260 that further provide an electrical connection to a first connector pad 270, which is also disposed on the second surface 154. In an embodiment the second plurality of runner strips 190 is electrically connected together via traces 262 that provide an electrical connection to a second connector pad 272, which is disposed on the second surface 154. Similarly, in an embodiment the third plurality of runner strips 200 is electrically connected together via traces 264 that provide an electrical connection to a third connector pad 274, which is disposed on the second surface 154.

Figure 7:
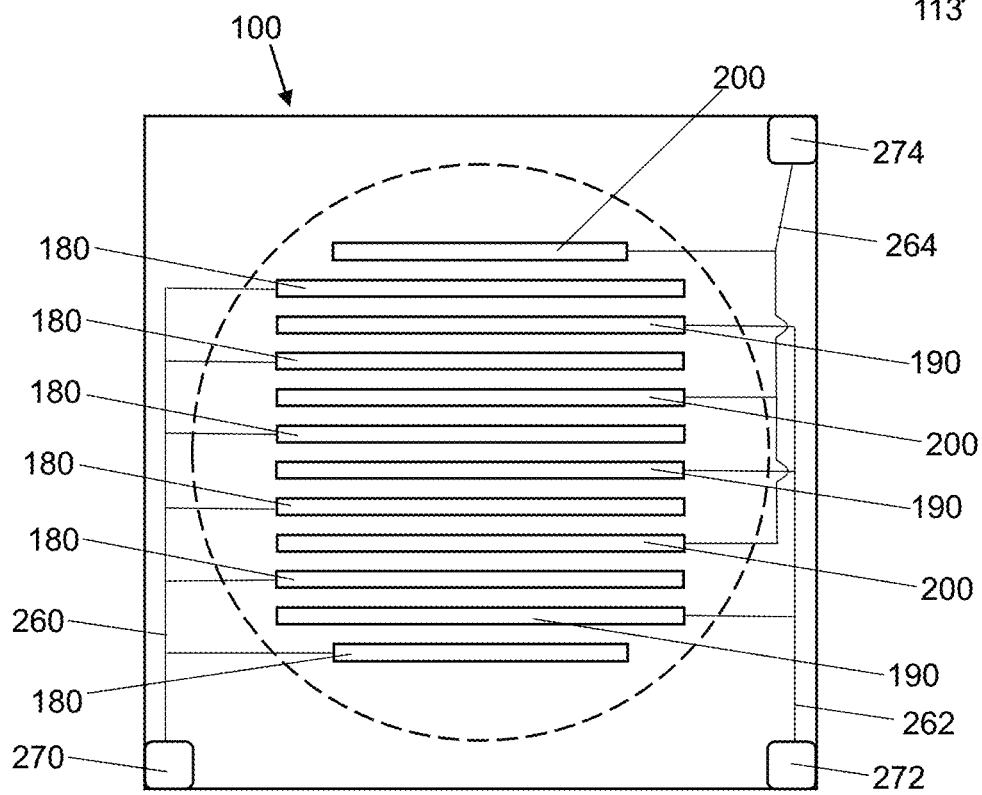
FIG. 7 is a schematic top view illustrating exemplary runner strips and electrical connections of an exemplary MEMS die according to another embodiment.

Referring now to FIGS. 3, 5B, and 7, in an embodiment the voltage source 220 is electrically connected to one or more first runner strips 180, for example, via the first connector pad 270, to provide a voltage bias to at least a subset of the first plurality of interconnect strips 180 relative to ground. A first electrical connection 76 is disposed between at least a subset of the second runner strips 190 and a first input 72 to the differential amplifier 230, for example, via the second connector pad 272, and a second electrical connection 78 is disposed between at least a subset of the third runner strips 200 and a second input 74 to the differential amplifier 230, for example, via the third connector pad 274.

It has been contemplated that the above described structure comprising the first, second, and third runner strips 180, 190, 200, and the first, second, and third plurality of interconnect strips 120, 130, 140, without the addition of the pillar electrodes A, B, C, provides a structural basis for an embodiment of a MEMS die for use within a MEMS device as further described below. In such an embodiment, each of the first, second, and third plurality of interconnect strips 120, 130, 140, is a continuous strip that functions as an electrode in its own right without the added materials and complications of the pillar electrodes A, B, C. In an embodiment, subsets of the first plurality of interconnect strips 120 that are disposed on the first diaphragm 102 are electrically connected to subsets of the first plurality of interconnect strips 120 that are disposed on the second diaphragm 104, for example, by a plurality of connecting pins that are analogous in structure with the pillar electrodes A. In an embodiment, the third plurality of interconnect strips 140 that are disposed on the second diaphragm 104 are electrically connected to third runner strips 200 by a plurality of pins that are analogous in structure with first and second pins 240 and 250.

Referring to FIG. 2A, in an embodiment, one or more of the second plurality of electrodes, B, is coaxially disposed with one or more of the third plurality of electrodes, C. Referring to FIG. 2B, in an embodiment the second end 166 of the one or more of the second plurality of electrodes, B, is connected by a dielectric support layer 280 to the second end 170 of the one or more of the third plurality of electrodes, C.

Referring to FIGS. 1 and 6A-6C, a vacuum region, near or partial vacuum region, or low pressure region 300 (hereinafter "low pressure region") is defined between the first diaphragm 102 and the second diaphragm 104. The low pressure region 300 in some embodiments has a pressure below atmospheric pressure. In an embodiment the low pressure region 300 has an internal pressure, for example, of less than 100,000 Pa. In another embodiment the low pressure region 300 has an internal pressure of less than 10,000 Pa. In a further embodiment the low pressure region 300 has an internal pressure of less than 1,000 Pa, and in yet another embodiment the low pressure region 300 has an internal pressure of less than 100 Pa.

In an embodiment the low pressure region 300 is bounded by the first sides 152, 156 of the first and second diaphragms 102, 104, respectively. Referring to FIGS. 6A-6C, in an embodiment, one or more sealed tunnels 310 extend through the first and second diaphragms 102, 104 without extending through the fixed dielectric element 110, for example, as illustrated on the left sides of FIGS. 6A-6C. In other embodiments, the one or more sealed tunnels 310 also extend through the fixed dielectric element 110, as illustrated on the right side of FIGS. 6A-6C. FIGS. 6A-6C illustrate the one or more sealed tunnels 310 proximate to an outer edge of the MEMS die 100; however, in other embodiments the one or more sealed tunnels 310 are disposed along a centerline or at any location along the radius of the MEMS die 100 as is desired or advantageous for that embodiment. In an embodiment the opening 123 of the substrate 111 at least partially overlaps vertically with the one or more sealed tunnels 310.

In an embodiment each sealed tunnel 310 is sealed by a bounding wall 312 shown in cross-section in FIGS. 6A-6C. In an embodiment, the geometry of the bounding wall 312 can be selected so that the cross-sectional shape of each sealed tunnel 310 as seen in plan view from above can be any regular or irregular shape as is desired or advantageous to the embodiment.

In an embodiment at least a portion of the bounding wall 312 is in contact with the material 117, as illustrated in FIG. 6A. The material 117 can be a sacrificial material, and the material 117 and the bounding wall 312 can, for example, be made of any insulative material as described hereinbelow. In an embodiment at least a portion of the bounding wall 312 is rigidly attached to the fixed dielectric element 110, as illustrated in FIG. 6B. In an embodiment at least a portion of the bounding wall 312 is not in contact with either the material 117 or the fixed dielectric element 110, as illustrated in FIG. 6C.

In an embodiment a first pierce 314 is disposed through the first diaphragm 102 and a second pierce 316 is disposed through the second diaphragm 104. The sealed tunnel 310 therefore provides fluid communication between and the second sides 154, 158 of the first and second diaphragms 102, 104, respectively, while maintaining the low pressure region 300 between the first and second diaphragms 102, 104.

In an embodiment the fixed dielectric element 110 and the first and second diaphragms 102,104 are each made from any insulative material that would not be damaged during a sacrificial layer removal process. For example, without limitation, the insulative material can be silicon nitride, silicon oxynitride, metal oxides, polymers, materials that are not damaged by a sacrificial layer removal process, and combinations thereof. Similarly, the material of any of the first, second, and third pluralities of electrodes A, B, C, the bounding wall 312, the first, second, and third interconnect strips 120, 130, 140, and the first, second, and third connector pads 270, 272, 274 can be any conductive material that would not be damaged during a sacrificial layer removal process. For example, without limitation, the conductive material can be polycrystalline silicon, one or more metals, alloys of metals, carbon, materials that are not damaged by a sacrificial layer removal process, and combinations thereof. In an embodiment, the first, second, and third runner strips 180, 190, 200, the traces 260, 262, 264, and the first and second pins 240, 250 are made from metal.

Figure 8:
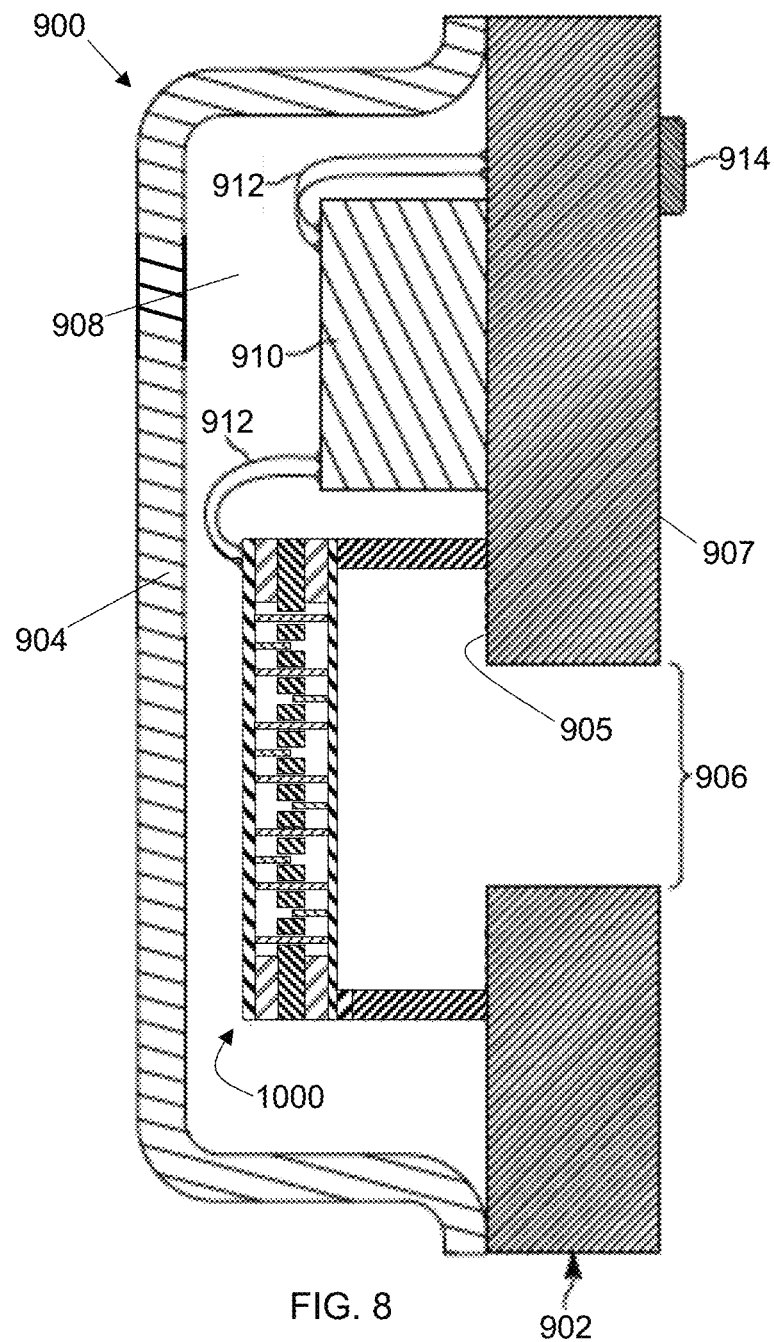
FIG. 8 is a cross-sectional view of a sensor device utilizing an exemplary MEMS die according to an embodiment.

Turning to FIG. 8, the MEMS die 100 used as an acoustic transducer 1000 is configured to fit within a sensor assembly, generally labeled 900. The assembly 900 includes a housing including a base 902 having a first surface 905 and an opposing second surface 907. The housing further includes a cover 904 (e.g., a housing lid), and an acoustic port 906. In an embodiment the port 906 extends between the first surface 905 and the second surface 907. In one implementation, the base 902 is a printed circuit board. The cover 904 is coupled to the base 902 (e.g., the cover 904 may be mounted onto a peripheral edge of the base 902). Together, the cover 904 and the base 902 form an enclosed volume 908 for the assembly 900.

As shown in FIG. 8, the acoustic port 906 is disposed on the base 902 and is structured to convey sound waves to the MEMS die 100 utilized as an acoustic transducer 1000 located within the enclosed volume 908. In other implementations, the acoustic port 906 is disposed on the cover 904 and/or a side wall of the cover 904. In some embodiments, the assembly 900 forms part of a compact computing device (e.g., a portable communication device, a smartphone, a smart speaker, an internet of things (IoT) device, etc.), where one, two, three or more assemblies may be integrated for picking-up and processing various types of acoustic signals such as speech and music.

The assembly 900 includes an electrical circuit disposed within the enclosed volume 908. In an embodiment, the electrical circuit includes an integrated circuit (IC) 910. In an embodiment the IC 910 is disposed on the first surface 905 of the base 902 and is electrically connected to the MEMS die 100 (as the acoustic transducer 1000). The IC 910 may be an application specific integrated circuit (ASIC). Alternatively, the IC 910 may include a semiconductor die integrating various analog, analog-to-digital, and/or digital circuits. In an embodiment the IC comprises a voltage source 220 and a differential amplifier 230. In an embodiment the cover 904 is disposed over the first surface 905 of the base 902 covering the MEMS acoustic transducer 1000 and the IC 910.

In the assembly 900 of FIG. 8, the MEMS acoustic transducer 1000 is illustrated as being disposed on the first surface 905 of the base 902. The MEMS acoustic transducer 1000 converts sound waves, received through acoustic port 906, and/or vibrations, and/or sensed accelerations into a corresponding electrical sensor signal, and generates an electrical signal (e.g., a voltage) at a transducer output in response to the acoustic activity incident on the port 906, the vibrations, and/or the sensed acceleration. As shown in FIG. 8, the transducer output includes a pad or terminal of the transducer 1000 that is electrically connected to the electrical circuit disposed within the enclosed volume 908 via one or more bonding wires 912. The assembly 900 of FIG. 8 further includes electrical contacts, shown schematically as contacts 914, typically disposed on a bottom surface of the base 902. The contacts 914 are electrically coupled to the electrical circuit disposed within the enclosed volume 908. The contacts 914 are configured to electrically connect the assembly 900 to one of a variety of host devices.

As noted hereinabove, a plurality of MEMS devices can be manufactured in a single batch process. Individual portions of the batch process representative of individual MEMS devices are known as dies. Accordingly, a number of MEMS dies can be manufactured in a single batch process and then cut apart or otherwise separated for further fabrication steps or for their ultimate use, which for example without limitation includes as an acoustic transducer or other portion of a microphone.

Steps in a production process utilized to produce the MEMS die 100 as described hereinabove include etching, masking, patterning, cutting, boring, and/or release steps executed on a workpiece. All of the steps are not described in detail herein. However, generally the portions of the workpiece that ultimately end up as the structure of the MEMS die 100 are layered onto the workpiece using sacrificial material, or otherwise bored or etched out of a solid block of material.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

Unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microelectromechanical systems (MEMS) die comprising:
   a diaphragm assembly, comprising:
      a first diaphragm having a first side and a second side;
      a second diaphragm having a first side facing the first side of the first diaphragm and a second side facing away from the first diaphragm;
      a first plurality of electrodes, each of the first plurality of electrodes having a first end connected to the first side of the first diaphragm and a second end connected to the first side of the second diaphragm, and a first plurality of interconnect strips disposed along the first side of the first diaphragm and the first side of the second diaphragm, wherein each of the first plurality of electrodes is in electrical communication with one of the first plurality of interconnect strips;
      a second plurality of electrodes, each of the second plurality of electrodes having a first end connected to the first side of the first diaphragm and a free second end, and a second plurality of interconnect strips disposed along the first side of the first diaphragm, wherein each of the second plurality of electrodes is in electrical communication with one of the second plurality of interconnect strips; and
      a third plurality of electrodes, each of the third plurality of electrodes having a first end connected to the first side of the second diaphragm and a free second end, and a third plurality of interconnect strips disposed along the first side of the second diaphragm, wherein each of the third plurality of electrodes is in electrical communication with one of the third plurality of interconnect strips.

2. The MEMS die of claim 1, further comprising:
   a first runner strip disposed along the second surface of the first diaphragm transverse to the first plurality of interconnect strips and electrically connected to at least a subset of the first plurality of interconnect strips via electrical connections disposed through the first diaphragm;
   a second runner strip disposed along the second surface of the first diaphragm transverse to the second plurality of interconnect strips and electrically connected to at least a subset of the second plurality of interconnect strips via electrical connections disposed through the first diaphragm; and
   a third runner strip disposed along the second surface of the first diaphragm transverse to the third plurality of interconnect strips and electrically connected to at least a subset of the third plurality of interconnect strips via electrical connections disposed through the first diaphragm.

3. The MEMS die of claim 2, further comprising:
   a fixed dielectric element spaced between the first and second diaphragms and including a plurality of apertures;
   wherein each electrode of the first, second, and third pluralities of electrodes is disposed at least partially within an aperture of the plurality of apertures, the fixed dielectric element surrounds the second ends of each of the second plurality of electrodes and the second ends of each of the third plurality of electrodes.

4. A MEMS device comprising:
   the MEMS die of claim 3;
   a voltage source electrically connected to the first runner strip to provide a voltage bias to at least the first subset of interconnect strips relative to ground;
   a differential amplifier;
   a first electrical connection between the second runner strip and a first input to the differential amplifier; and
   a second electrical connection between the third runner strip and a second input to the differential amplifier.

5. The MEMS device of claim 4, further comprising:
   an integrated circuit (IC), wherein the IC comprises the voltage source and the differential amplifier; and
   a housing comprising:
      a base having a first surface, an opposing second surface, and a port;
      a cover attached to the first surface of the base, wherein the cover and the base define an interior of the housing,
      wherein the port extends between the first surface and the second surface, and the diaphragm assembly is disposed within the interior of the housing such that the second diaphragm is over the port; and
      wherein the integrated circuit (IC) is disposed within the interior of the housing and electrically connected to the diaphragm assembly.

6. The MEMS die according to claim 3, wherein the first, second, and third pluralities of electrodes are movable relative to the solid dielectric.

7. The MEMS die according to claim 3, wherein one or more of the second plurality of electrodes is coaxially disposed with one or more of the third plurality of electrodes.

8. The MEMS die according to claim 7, wherein the second end of the one or more of the second plurality of electrodes is connected by a dielectric support layer to the second end of the one or more of the third plurality of electrodes.

9. The MEMS die of claim 1, wherein the first, second, and third pluralities of interconnect strips and the first, second, and third pluralities of electrodes are made from polysilicon and the first, second, and third runners are made from metal.

10. The MEMS die of claim 1, wherein a low pressure region is defined between the first side of the first diaphragm and the first side of the second diaphragm.

11. The MEMS die according to claim 10 further comprising a tunnel structure disposed through the first and second diaphragms, wherein the tunnel structure provides fluid communication between the second sides of the first and second diaphragms, and wherein the tunnel structure is configured to maintain the low pressure region disposed between the first sides of the first and second diaphragms outside of the tunnel structure.

12. A microelectromechanical systems (MEMS) die comprising:
   a diaphragm assembly, comprising:
      a first diaphragm having a first side and a second side;
      a second diaphragm having a first side facing the first side of the first diaphragm and a second side facing away from the first diaphragm;
      a first plurality of interconnect strips disposed along the first side of the first diaphragm and the first side of the second diaphragm;
      a first plurality of electrodes, each of the first plurality of electrodes having a first end connected to the first side of the first diaphragm and a second end connected to the first side of the second diaphragm, wherein each of the first plurality of electrodes is in electrical communication with one of the first plurality of interconnect strips;
      a second plurality of interconnect strips disposed along the first side of the first diaphragm;
      a second plurality of electrodes, each of the second plurality of electrodes having a first end connected to the first side of the first diaphragm in electrical communication with one of the second plurality of interconnect strips, and a free second end;
      a third plurality of interconnect strips disposed along the first side of the second diaphragm;
      a third plurality of electrodes, each of the third plurality having a first end connected to the first side of the second diaphragm in electrical communication with one of the third plurality of interconnect strips, and a free second end;
      a first runner strip disposed along the second surface of the first diaphragm transverse to the first plurality of interconnect strips and electrically connected to at least a subset of the first plurality of interconnect strips via electrical connections disposed through the first diaphragm;
      a second runner strip disposed along the second surface of the first diaphragm transverse to the second plurality of interconnect strips and electrically connected to at least a subset of the second plurality of interconnect strips via electrical connections disposed through the first diaphragm; and
      a third runner strip disposed along the second surface of the first diaphragm transverse to the third plurality of interconnect strips and electrically connected to at least a subset of the third plurality of interconnect strips via electrical connections disposed through the first diaphragm;
      a fixed dielectric element spaced between the first and second diaphragms and including a plurality of apertures;
      wherein each electrode of the first, second, and third pluralities of electrodes is disposed at least partially within an aperture of the plurality of apertures, the fixed dielectric element surrounds the second ends of each of the second plurality of electrodes and the second ends of each of the third plurality of electrodes.

13. A MEMS device comprising:
   the MEMS die of claim 12;
   a voltage source electrically connected to the first runner strip to provide a voltage bias to at least the first subset of interconnect strips relative to ground;
   a differential amplifier;
   a first electrical connection between the second runner strip and a first input to the differential amplifier; and
   a second electrical connection between the third runner strip and a second input to the differential amplifier.

14. The MEMS die of claim 12, wherein the first, second, and third pluralities of interconnect strips and the first, second, and third pluralities of electrodes are made from polysilicon, and the first, second, and third runners are made from metal.

15. The MEMS die of claim 12, wherein a low pressure region is defined between the first side of the first diaphragm and the first side of the second diaphragm.

16. The MEMS die according to claim 15 further comprising a tunnel structure disposed through the first and second diaphragms, wherein the tunnel structure provides fluid communication between the second sides of the first and second diaphragms, and wherein the tunnel structure is configured to maintain the low pressure region disposed between the first sides of the first and second diaphragms outside of the tunnel structure.

17. The MEMS device of claim 13, further comprising:
   an integrated circuit (IC);
   a housing comprising:
      a base having a first surface, an opposing second surface, and a port;
      a cover attached to the first surface of the base, wherein the cover and the base define an interior of the housing,
      wherein the port extends between the first surface and the second surface, and the diaphragm assembly is disposed within the interior of the housing such that the second diaphragm is over the port; and
      wherein the integrated circuit (IC) is disposed within the interior of the housing and electrically connected to the diaphragm assembly.

18. A microelectromechanical systems (MEMS) device comprising:
   a MEMS die, comprising:
      a diaphragm assembly, comprising:
         a first diaphragm having a first side and a second side;
         a second diaphragm having a first side facing the first side of the first diaphragm and a second side facing away from the first diaphragm;
         a first plurality of interconnect strips disposed along at least one of the first side of the first diaphragm and the first side of the second diaphragm;
         a first plurality of electrodes, each of the first plurality of electrodes having a first end connected to the first side of the first diaphragm and a second end connected to the first side of the second diaphragm, wherein each of the first plurality of electrodes is in electrical communication with one of the first plurality of interconnect strips;

a second plurality of interconnect strips disposed along the first side of the first diaphragm;
a second plurality of electrodes, each of the second plurality of electrodes having a first end connected to the first side of the first diaphragm in electrical communication with one of the second plurality of interconnect strips, and a free second end;
a third plurality of interconnect strips disposed along the first side of the second diaphragm;
a third plurality of electrodes, each of the third plurality having a first end connected to the first side of the second diaphragm in electrical communication with one of the third plurality of interconnect strips and a free second end;
a first runner strip disposed along the second surface of the first diaphragm transverse to the first plurality of interconnect strips and electrically connected to at least a subset of the first plurality of interconnect strips via electrical connections disposed through the first diaphragm;
a second runner strip disposed along the second surface of the first diaphragm transverse to the second plurality of interconnect strips and electrically connected to at least a subset of the second plurality of interconnect strips via electrical connections disposed through the first diaphragm; and
a third runner strip disposed along the second surface of the first diaphragm transverse to the third plurality of interconnect strips, wherein the third runner strip is electrically connected to at least a subset of the third plurality of interconnect strips via electrical connections each comprising a first pin disposed through the first diaphragm connecting the third runner strip to a second pin disposed between the first and second diaphragms and electrically connected to one of the third plurality of interconnect strips;
a fixed dielectric element spaced between the first and second diaphragms and including a plurality of apertures;
wherein each electrode of the first, second, and third pluralities of electrodes is disposed at least partially within an aperture of the plurality of apertures, the fixed dielectric element surrounds the second ends of each of the second plurality of electrodes and the second ends of each of the third plurality of electrodes;
a voltage source electrically connected to the first runner strip to provide a voltage bias to at least the first subset of interconnect strips relative to ground;
a differential amplifier;
a first electrical connection between the second runner strip and a first input to the differential amplifier; and
a second electrical connection between the third runner strip and a second input to the differential amplifier;
wherein the first, second, and third pluralities of interconnect strips and the first, second, and third pluralities of electrodes are made from polysilicon and the first, second, and third runners are made from metal.

19. The MEMS device of claim 18, wherein a low pressure region is defined between the first side of the first diaphragm and the first side of the second diaphragm, and further comprising a tunnel structure disposed through the first and second diaphragms, wherein the tunnel structure provides fluid communication between the second sides of the first and second diaphragms, and wherein the tunnel structure is configured to maintain the low pressure region disposed between the first sides of the first and second diaphragms outside of the tunnel structure.

20. A microelectromechanical systems (MEMS) die comprising:
a diaphragm assembly, comprising:
a first diaphragm having a first side and a second side;
a second diaphragm having a first side facing the first side of the first diaphragm and a second side facing away from the first diaphragm;
a first plurality of interconnect strips disposed along at least one of the first side of the first diaphragm and the first side of the second diaphragm;
a second plurality of interconnect strips disposed along the first side of the first diaphragm;
a third plurality of interconnect strips disposed along the first side of the second diaphragm;
a first runner strip disposed along the second surface of the first diaphragm transverse to the first plurality of interconnect strips and electrically connected to at least a subset of the first plurality of interconnect strips via electrical connections disposed through the first diaphragm;
a second runner strip disposed along the second surface of the first diaphragm transverse to the second plurality of interconnect strips and electrically connected to at least a subset of the second plurality of interconnect strips via electrical connections disposed through the first diaphragm; and
a third runner strip disposed along the second surface of the first diaphragm transverse to the third plurality of interconnect strips and electrically connected to at least a subset of the third plurality of interconnect strips via electrical connections disposed through the first diaphragm.

21. The MEMS die of claim 20, further comprising:
a first plurality of electrodes, each of the first plurality of electrodes having a first end connected to the first side of the first diaphragm and a second end connected to the first side of the second diaphragm, wherein each of the first plurality of electrodes is in electrical communication with one of the first plurality of interconnect strips;
a second plurality of electrodes, each of the second plurality of electrodes having a first end connected to the first side of the first diaphragm in electrical communication with one of the second plurality of interconnect strips, and a free second end; and
a third plurality of electrodes, each of the third plurality of electrodes having a first end connected to the first side of the second diaphragm in electrical communication with one of the third plurality of interconnect strips, and a second free end.

22. The MEMS die of claim 21, further comprising:
a fixed dielectric element spaced between the first and second diaphragms and including a plurality of apertures;
wherein each electrode of the first, second, and third pluralities of electrodes is disposed at least partially within an aperture of the plurality of apertures, the fixed dielectric element surrounds the second ends of each of the second plurality of electrodes and the second ends of each of the third plurality of electrodes.

23. The MEMS die of claim 22, wherein the third runner strip is electrically connected to at least the subset of the third plurality of interconnect strips via electrical connections each comprising a first pin disposed through the first diaphragm connecting the third runner strip to a second pin disposed between the first and second diaphragms and electrically connected to one of the third plurality of interconnect strips.

* * * * *